United States Patent [19]

Sumner, Jr.

[11] Patent Number: 5,032,426
[45] Date of Patent: Jul. 16, 1991

[54] METHOD AND APPARATUS FOR APPLYING LIQUID COATINGS ON THE SURFACE OF PRINTED CIRCUIT BOARDS

[75] Inventor: Harold R. Sumner, Jr., Lafayette, Ind.

[73] Assignee: Enthone, Incorporated, West Haven, Conn.

[21] Appl. No.: 351,222

[22] Filed: May 15, 1989

[51] Int. Cl.$^5$ ............................................. C23C 26/00
[52] U.S. Cl. ................................. 427/96; 427/372.2; 427/294
[58] Field of Search ............ 427/96, 372.2, 294

[56] References Cited

U.S. PATENT DOCUMENTS

| | | | |
|---|---|---|---|
| 3,433,888 | 3/1969 | Tally | 427/96 |
| 3,465,435 | 9/1969 | Steranko | 427/96 |
| 4,031,268 | 6/1977 | Fairbairn | 427/423 |
| 4,436,806 | 3/1984 | Rendulic | 430/281 |
| 4,600,601 | 7/1986 | Tamura | 427/424 |
| 4,678,531 | 7/1987 | Metzger | 427/96 |
| 4,784,310 | 11/1988 | Metzger | 427/96 |
| 4,799,958 | 1/1989 | Morris | 427/96 |

Primary Examiner—Shrive P. Beck
Assistant Examiner—Vi Duong Dang
Attorney, Agent, or Firm—John J. Tomaszewski

[57] ABSTRACT

A method and apparatus is provided for applying liquid coatings such as solder masks sequentially to both sides of a printed circuit board substrate whereby only one drying operation would be needed to dry the liquid coatings. An isolation platen having openings corresponding to the coated parts of the board is used to provide a space between the coated part and the opposite side of the platen.

2 Claims, 2 Drawing Sheets

METHOD AND APPARATUS FOR APPLYING LIQUID COATINGS ON THE SURFACE OF PRINTED CIRCUIT BOARDS

This invention relates to a method and apparatus for applying liquid coatings on the surface of printed circuit boards.

BACKGROUND OF THE INVENTION

The manufacture of printed circuit boards requires a number of steps to form the desired end product since the board is, in effect, a multilayer configuration of conductor lines, resist layers, solder masks, etc. Regardless of the method of manufacture, however, liquid coatings requiring drying before further processing must be applied to the board surface at various points in the process.

One particular coating used in the fabrication of high quality printed circuit boards is a solder mask which serves to protect the circuitry from bridging together during soldering and which must be resistant to solvents, chemicals and flux compositions. For convenience, the following description will be directed to this particular material and its application to the board by conventional screen printing techniques although it will be appreciated by those skilled in the art that other liquids and other methods of application could also be employed.

Basically, the screen printing technique involves squeezing a composition through the open meshes of a stretched piece of material such as wire onto a printable substrate. The screen is covered or blocked out in part by a masking material in order to form the desired pattern on the printable substrate. The masking material may simply be a stencil or a dried lacquer, shellac or glue. Once the screen has been covered or blocked out in part by a masking material, it is held taut on a frame and positioned over the desired substrate. The coating composition is then poured onto the screen and squeezed through the open areas with a squeegee. Thereafter, the frame is removed and the coated substrate baked. This procedure is then repeated for the other side of the board.

It is important, when following a desired pattern, that the composition does not flow or bleed outside of the preselected areas defined by the open area of the screen but should follow accurately the image formed on the screen and reproduce it. These known techniques to produce screen coatings are described for example in U.S. Pat. No. 4,292,230, which patent is hereby incorporated by reference.

As noted above, and as specified by manufacturers of the screen printing compositions, e.g., photo-imageable solder masks, the material is applied to one side of a printed circuit board, baked (dried) in an oven, and the process repeated for the other side of the board. Both sides cannot now be done simultaneously because the screen printed board is wet and must be dried before it can be inverted and coated on the opposite side.

Aside from the inefficiencies with having to perform two drying cycles and associated processing stages, one side is necessarily subjected to the two drying cycles and unless care is exercised to control the drying temperature and duration, the subsequent development cycle to remove the solder mask from areas designated by the printed circuit board artwork may not be successful and a residue may remain on the surfaces that are required to be clean copper.

A number of patents have issued addressing the problem of coating the surfaces of boards but these require complicated machines and complicated procedures to perform the process. For example, U.S. Pat. No. 4,600,601 uses an apparatus which passes an inclined board through a shower of coating liquid and then pivots the board and feeds the other side of the inclined board through the shower. U.S. Pat. No. 4,678,531 shows a method for screen printing an electrical fabrication substance onto a substrate surface to which a device having a substantial height relative to the thickness of the printing screen had been previously mounted. U.S. Pat. No. 4,436,806 is directed to making a resist pattern on circuit boards using a photo tool in registration with the circuit board blanks while the image is still wet. The uncured polymer which remains liquid is removed after imaging so that the board can be processed by etch resist, plate resist or solder mask techniques. U.S. Pat. No. 4,031,268 shows a method of spraying metallic patterns onto a substrate using a template.

The need still remains, however, for a method for preparing printed circuit boards in an efficient and economical manner.

It is therefore an object of the present invention to provide a method for applying liquid coatings sequentially on both surfaces of printed circuit boards, which coatings may then be dried in one drying step.

It is another object of this invention to provide an article of manufacture which may be used to apply liquid coatings on printed circuit boards.

These and other objects and advantages of the present invention will become readily apparent from the following description and illustrative embodiments.

SUMMARY OF THE INVENTION

A method is provided for applying liquid coatings, e.g., solder masks, sequentially to both surfaces of a substrate such as printed circuit boards whereby only one drying cycle need be used to dry the liquid coatings. In general, the method comprises applying a coating to one side of the substrate, placing an isolation platen on the coated substrate, which platen has openings corresponding to the coated parts of the substrate and a space between the coated parts and the opposite side of the platen, inverting the substrate and platen, applying a coating to the other side of the substrate and drying the substrate.

The isolation platen article of manufacture of the invention generally is made to provide adequate openings to correspond to the coated areas of the substrate and is of sufficient thickness to provide sufficient support for the substrate when it is inverted and coated on the opposite side. Any suitable material such as plastic may be employed.

DESCRIPTION OF THE PREFERRED EMBODIMENTS

Figure 1:
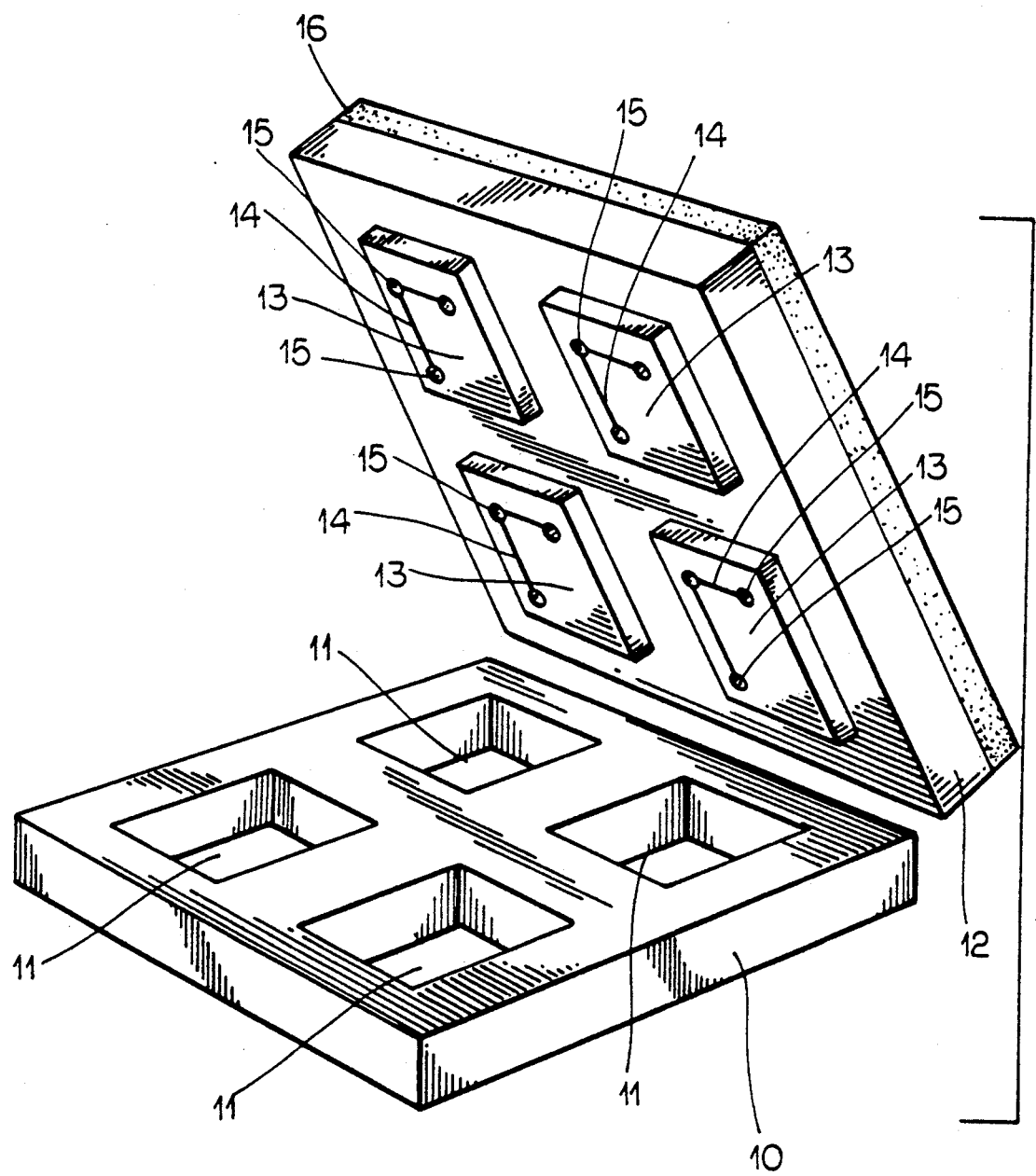
FIG. 1 is an exploded perspective view of the isolation platen and a one-sided coated substrate having a screen printer in position on the other side of the substrate.

Referring to FIG. 1, an isolation platen 10, of a material suitable to act as a support for screen printing a substrate 12, contains apertures 11 which apertures correspond to the printed circuit boards 13 screen printed on the substrate. In the figure four (4) printed circuit boards are being prepared and it will be appreciated that any number of openings 11 and printed circuit boards 13 could be prepared with the proviso that there are at least as many corresponding openings 11 as printed circuit boards 13.

The printed circuit boards 13 may contain circuitry 14 and through-holes 15 and other coatings or layers thereon (not shown). Isolation platen 10 can be of any height which is both structurally supportive and higher than the printed circuit board coating 13 on the substrate 12.

A printing screen 16 is shown on the substrate 12, which screen is in position to be used to apply a coating to that side of the substrate. After screen printing the second side of the substrate 12, the screen 16 is removed and substrate 12, which is now coated on both sides thereof with a wet liquid coating, is removed from the platen 10 and dried.

Figure 2A:
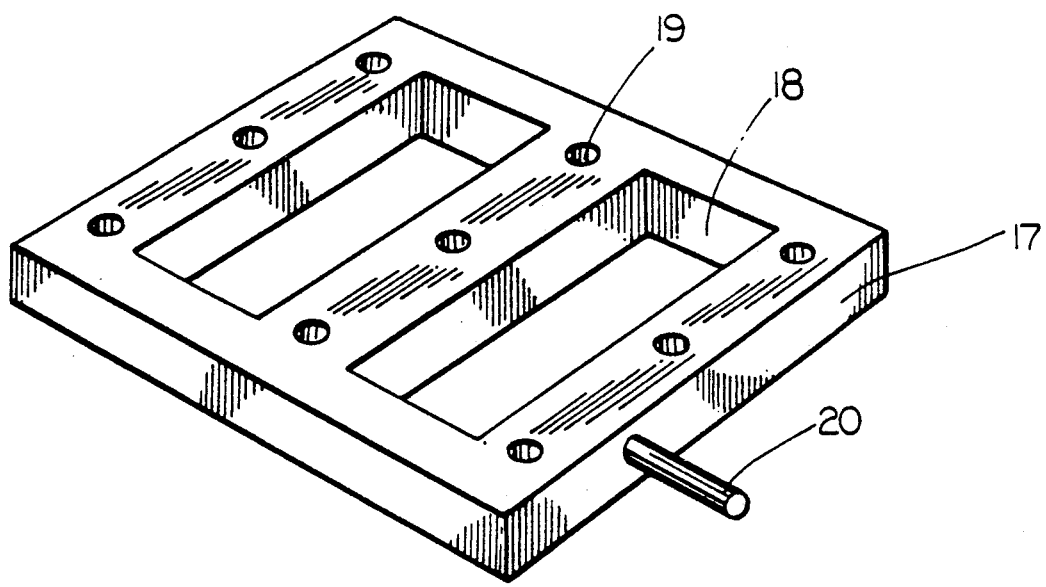
FIGS. 2A and 2B are perspective views of other isolation platens of the invention.
Figure 2B:
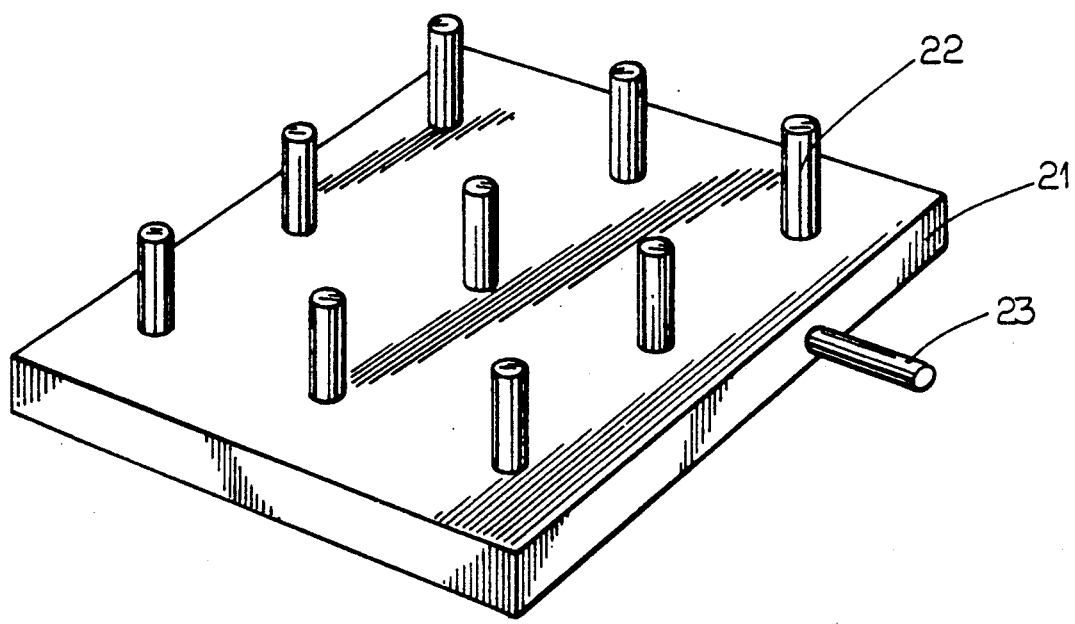

Referring now to FIG. 2A and FIG. 2B, two other isolation platens 17 and 21 are shown. The platen 17 of FIG. 2A is similar to platen 10 except that it is hollow and contains openings 19 which communicate with a substrate placed on the platen 17. Port 20 is a conduit for a vacuum or other means which serves to hold a substrate in place when the substrate is placed on the platen 17 and the vacuum applied.

FIG. 2B shows another platen 21 embodiment which is also used with a vacuum through port 23 and opening ports 22. In operation, a substrate such as substrate 12 is placed on platen 21 and, when the vacuum is applied, holds the substrate in place while the other side of the substrate is screen printed. As will be appreciated, with any platen embodiment the overall design consideration is that the printed substrate surface not come in contact with any part of the platen.

Registration pins may also be used in the isolation platen to align the platen and the substrate being coated.

It will be apparent that many changes and modifications of the several features described herein may be made without departing from the spirit and scope of the invention. It is therefore apparent that the foregoing description is by way of illustration of the invention rather than limitation of the invention.

I claim:

1. A method for applying liquid coatings sequentially to both sides of a printed circuit board substrate whereby only one drying cycle need be used to dry the liquid coatings comprising applying a coating to one side of the substrate, placing an isolation platen in contact with the coated side of said substrate, which platen has openings corresponding to the coated parts of the substrate and a space between the coated parts and the opposite side of the platen, inverting the substrate and platen, applying a coating to the other side of the substrate and drying the coated substrate.

2. The method of claim 1 wherein the isolation platen is hollow and contains openings which communicate with the substrate placed on the platen, which openings hold the substrate in place when the coated substrate is placed on the platen and a vacuum applied.

* * * * *